(12) United States Patent
Greenlee et al.

(10) Patent No.: US 11,158,718 B2
(45) Date of Patent: Oct. 26, 2021

(54) ASSEMBLIES WHICH INCLUDE WORDLINES HAVING A FIRST METAL-CONTAINING MATERIAL AT LEAST PARTIALLY SURROUNDING A SECOND METAL-CONTAINING MATERIAL AND HAVING DIFFERENT CRYSTALLINITY THAN THE SECOND METAL-CONTAINING MATERIAL

(71) Applicant: Micron Technology, inc., Boise, ID (US)

(72) Inventors: Jordan D. Greenlee, Boise, ID (US); Rita J. Klein, Boise, ID (US); Everett A. McTeer, Eagle, ID (US); John Mark Meldrim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/383,862

(22) Filed: Apr. 15, 2019

(65) Prior Publication Data
US 2020/0328284 A1 Oct. 15, 2020

(51) Int. Cl.
*H01L 29/49* (2006.01)
*H01L 27/11556* (2017.01)
(Continued)

(52) U.S. Cl.
CPC .... *H01L 29/4966* (2013.01); *H01L 27/11556* (2013.01); *H01L 27/11582* (2013.01); *H01L 27/11519* (2013.01); *H01L 27/11565* (2013.01)

(58) Field of Classification Search
CPC .................................................. H01L 29/4925
See application file for complete search history.

(56) References Cited

U.S. PATENT DOCUMENTS 8,258,034 B2 9/2012 Ramaswamy et al.
2009/0200593 A1* 8/2009 Uchiyama ....... H01L 21/823437
257/296
(Continued)

FOREIGN PATENT DOCUMENTS

TW 109109013 1/2021

OTHER PUBLICATIONS

Breuil et al., "Optimization of Ru based Hybrid Floating Gate for Planar NAND Flash", 2015 IEEE International Memory Workshop (IMW), 4 pages.
(Continued)

*Primary Examiner* — Christopher A Johnson
(74) *Attorney, Agent, or Firm* — Wells St. John P.S.

(57) ABSTRACT

Some embodiments include a memory array having a vertical stack of alternating insulative levels and wordline levels. Channel material extends vertically along the stack. The wordline levels include conductive regions which have a first metal-containing material and a second metal-containing material. The first metal-containing material at least partially surrounds the second metal-containing material. The first metal-containing material has a different crystallinity than the second metal-containing material. In some embodiments the first metal-containing material is substantially amorphous, and the second metal-containing material has a mean grain size within a range of from greater than or equal to about 5 nm to less than or equal to about 200 nm. Charge-storage regions are adjacent the wordline levels. Charge-blocking regions are between the charge-storage regions and the conductive regions.

47 Claims, 11 Drawing Sheets

(51) Int. Cl.
  *H01L 27/11582* (2017.01)
  *H01L 27/11565* (2017.01)
  *H01L 27/11519* (2017.01)

(56) References Cited

U.S. PATENT DOCUMENTS

| | | |
|---|---|---|
| 2012/0267702 A1 | 10/2012 | Jee et al. |
| 2014/0162440 A1 | 6/2014 | Kim et al. |
| 2016/0300845 A1* | 10/2016 | Ishizaki ............ H01L 27/11582 |
| 2017/0062472 A1 | 3/2017 | Park et al. |
| 2017/0256316 A1* | 9/2017 | Maejima ................ G11C 16/26 |
| 2017/0373079 A1 | 12/2017 | Sharangpani et al. |
| 2018/0033646 A1 | 2/2018 | Sharangpani et al. |
| 2019/0096808 A1* | 3/2019 | Tsutsumi .............. H01L 23/535 |

OTHER PUBLICATIONS

WO PCT/US2020/020884 Search Rept., dated Jun. 29, 2020, Micron Technology, Inc.
WO PCT/US2020/020884 Written Opin, dated Jun. 29, 2020, Micron Technology, Inc.

* cited by examiner

ASSEMBLIES WHICH INCLUDE WORDLINES HAVING A FIRST METAL-CONTAINING MATERIAL AT LEAST PARTIALLY SURROUNDING A SECOND METAL-CONTAINING MATERIAL AND HAVING DIFFERENT CRYSTALLINITY THAN THE SECOND METAL-CONTAINING MATERIAL

TECHNICAL FIELD

Assemblies (e.g., NAND memory architectures) which include wordlines having a first metal-containing material at least partially surrounding a second metal-containing material and having different crystallinity than the second metal-containing material.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page =16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Three-dimensional NAND architectures may have multiple vertically-stacked wordlines. Each of the wordlines may comprise a conductive liner surrounding a metal-containing core material. The conductive liner may have any of numerous purposes; and may, for example, improve adhesion of the core material, provide desired workfunction properties, etc. There is a continuing goal to increasing the number of stacked memory cells within three-dimensional NAND, and a corresponding goal to increase the number of vertically-stacked wordlines within a NAND memory array.

A problem which may be encountered during the fabrication of NAND architecture is that wafers comprising NAND components may bow; which can complicate the fabrication, and which may even destroy the wafers. The problem may become increasingly severe with increasing numbers of vertically-stacked wordlines.

It would be desirable to develop improved designs which alleviate the above-discussed problem.

BRIEF DESCRIPTION OF THE DRAWINGS

FIG. 5 is along the line 5-5 of FIG. 5A.

DETAILED DESCRIPTION OF THE ILLUSTRATED EMBODIMENTS

Some embodiments include NAND memory arrays having conductive wordlines which contain first metal-containing material and second metal-containing material. The first metal-containing material may substantially envelop the second metal-containing material, or may at least partially surround the second metal-containing material; and may comprise less crystallinity than the second metal-containing material. In some embodiments, the first metal-containing material may be substantially amorphous, and the second metal-containing material may comprise a median grain size within a range of from at least about 5 nanometers (nm) to less than or equal to about 200 nm; with the term "about 5 nm" meaning 5 nm to within reasonable tolerances of fabrication and measurement, and the term "about 200 nm" meaning 200 nm to within reasonable tolerances of fabrication and measurement. The first and second metal-containing materials may be a same composition as one another, or may comprise different compositions relative to one another. In some embodiments, the first metal-containing material may be a metal nitride (e.g., tungsten nitride, titanium nitride, etc.) and the second metal-containing material may consist essentially of metal (e.g., tungsten, titanium, etc.). The first metal-containing material may be formed to be very thin, and in some embodiments may have a thickness of less than or equal to about 100 angstroms (Å). The first metal-containing material may or may not be continuous.

The utilization of a thin, first metal-containing material having relatively low crystallinity as compared to the second metal-containing material may enable NAND memory arrays to be formed without the problematic wafer bowing described above in the Background section. Example embodiments and advantages are described with reference to FIGS. 5-12.

Figure 1:
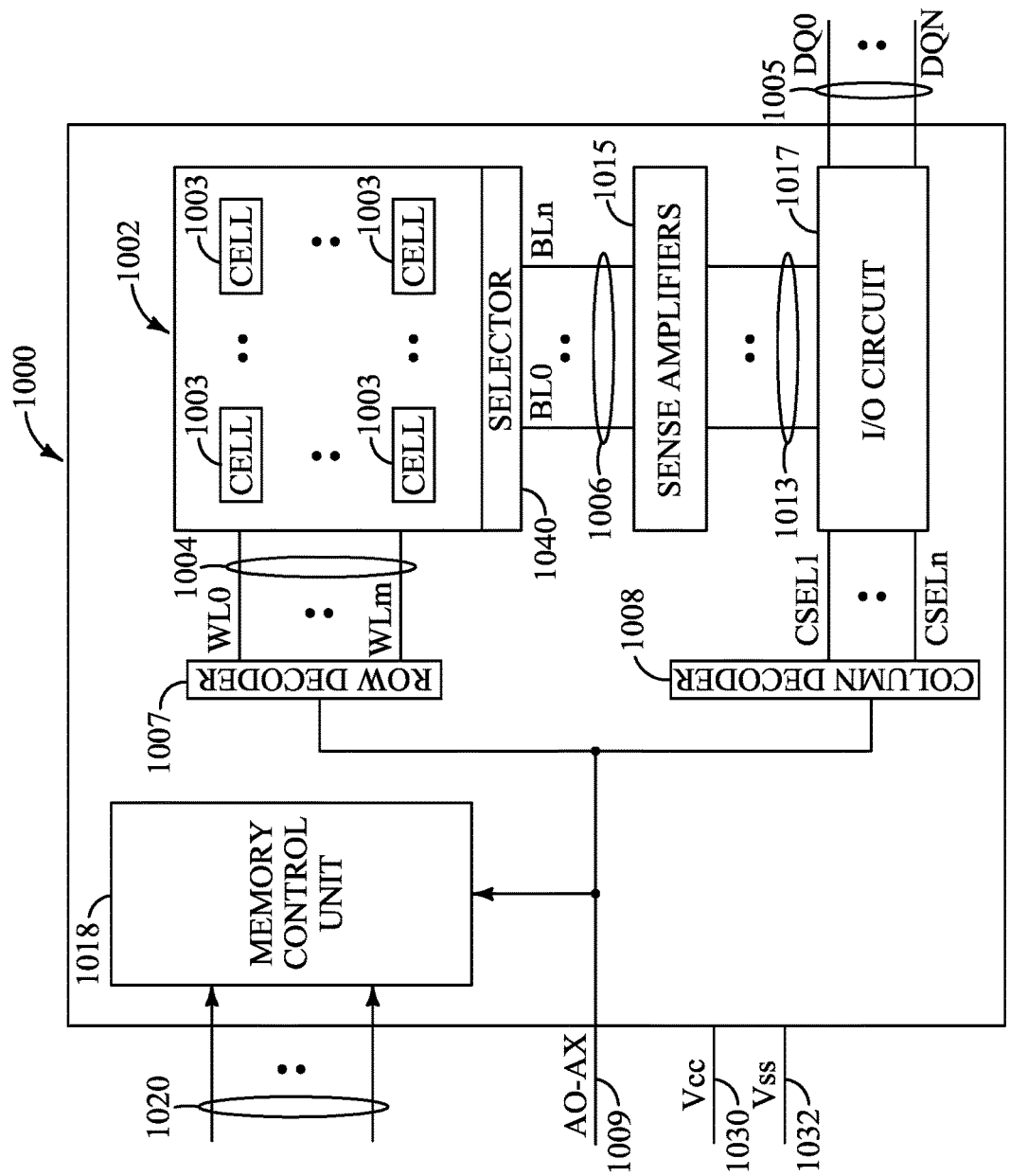
FIG. 1 shows a block diagram of a prior art memory device having a memory array with memory cells.
Figure 2:
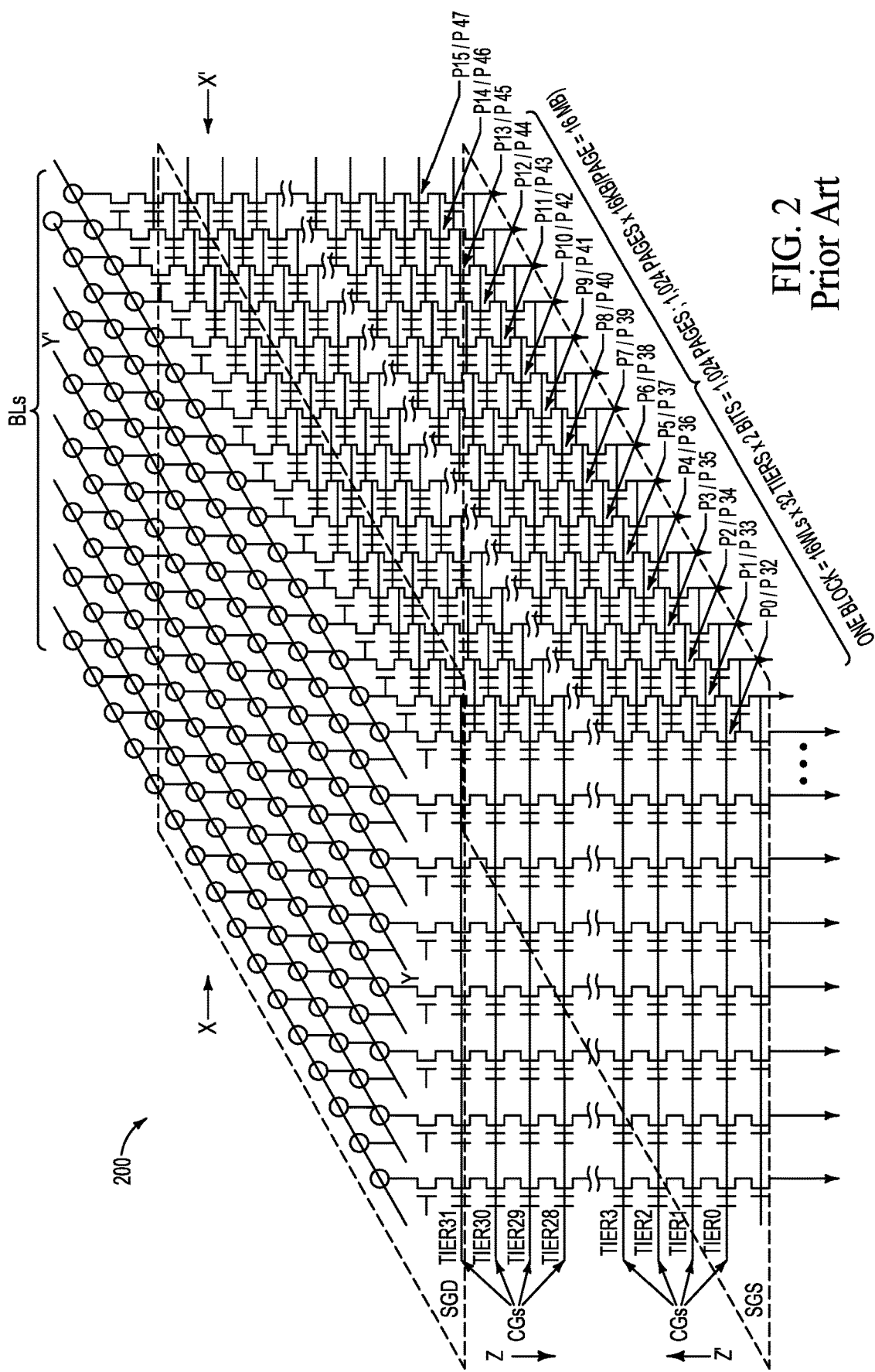
FIG. 2 shows a schematic diagram of the prior art memory array of FIG. 1 in the form of a 3D NAND memory device.
Figure 3:
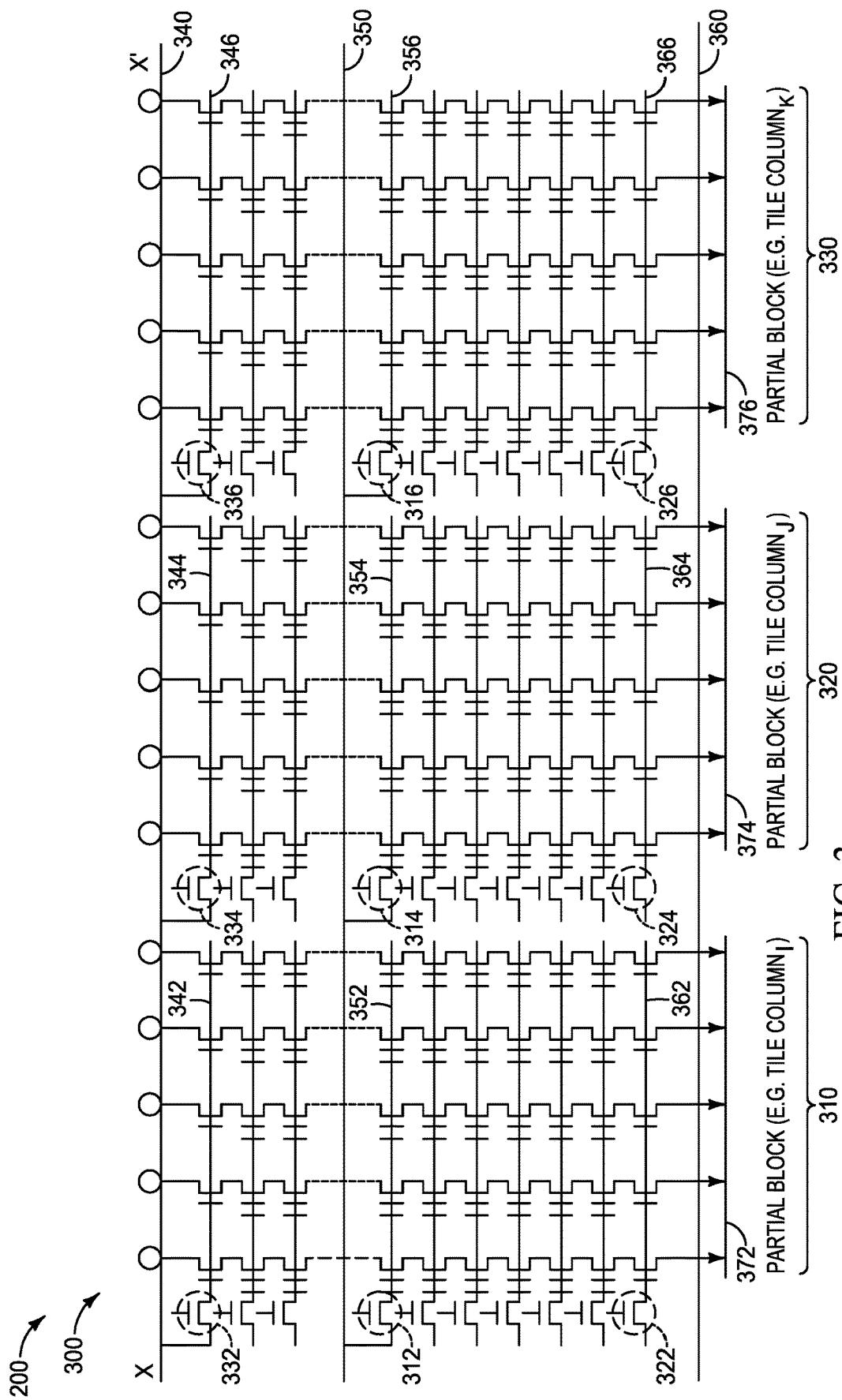
FIG. 3 shows a cross-sectional view of the prior art 3D NAND memory device of FIG. 2 in an X-X' direction.
Figure 4:
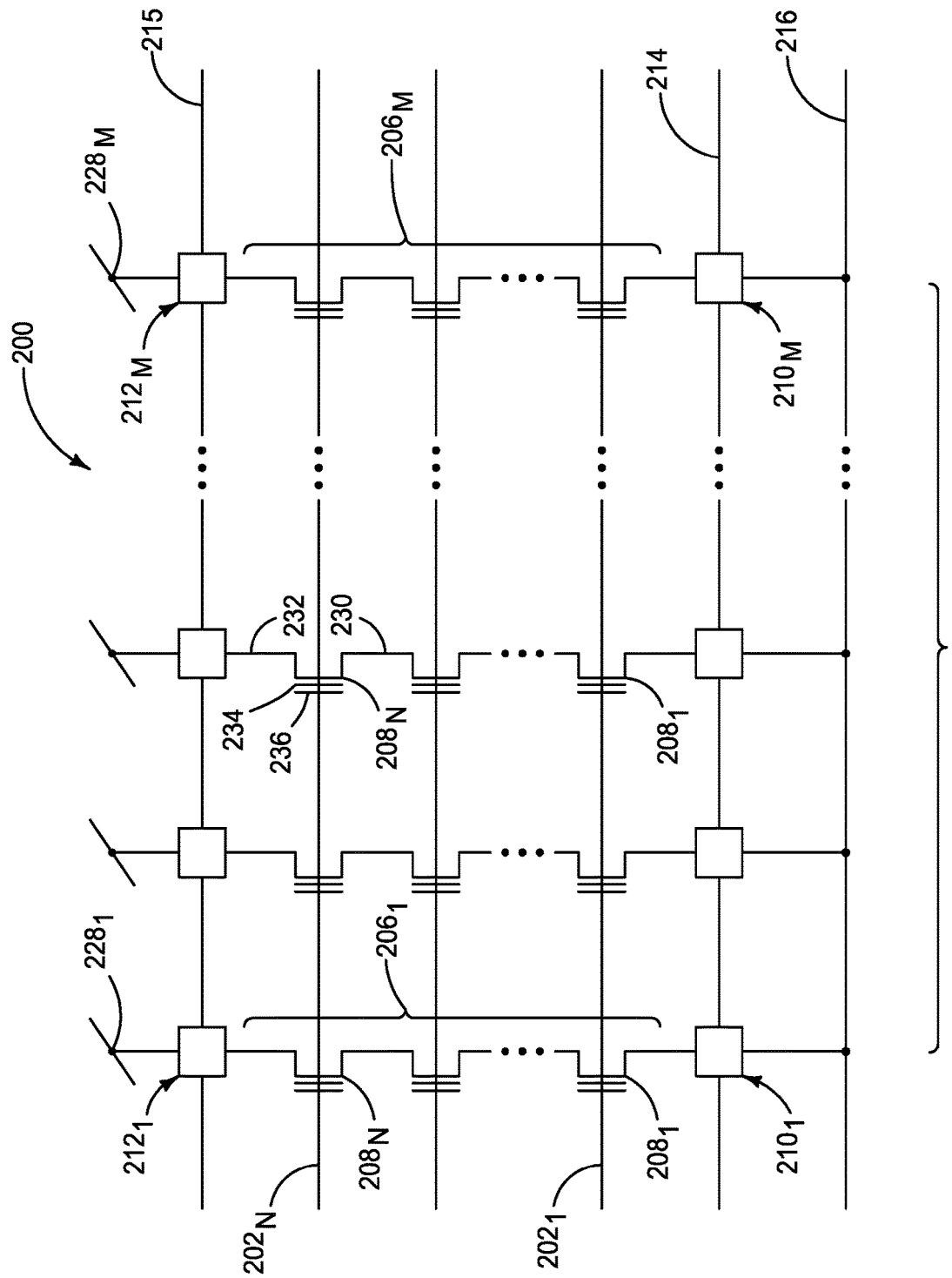
FIG. 4 is a schematic diagram of a prior art NAND memory array.
Figure 5:
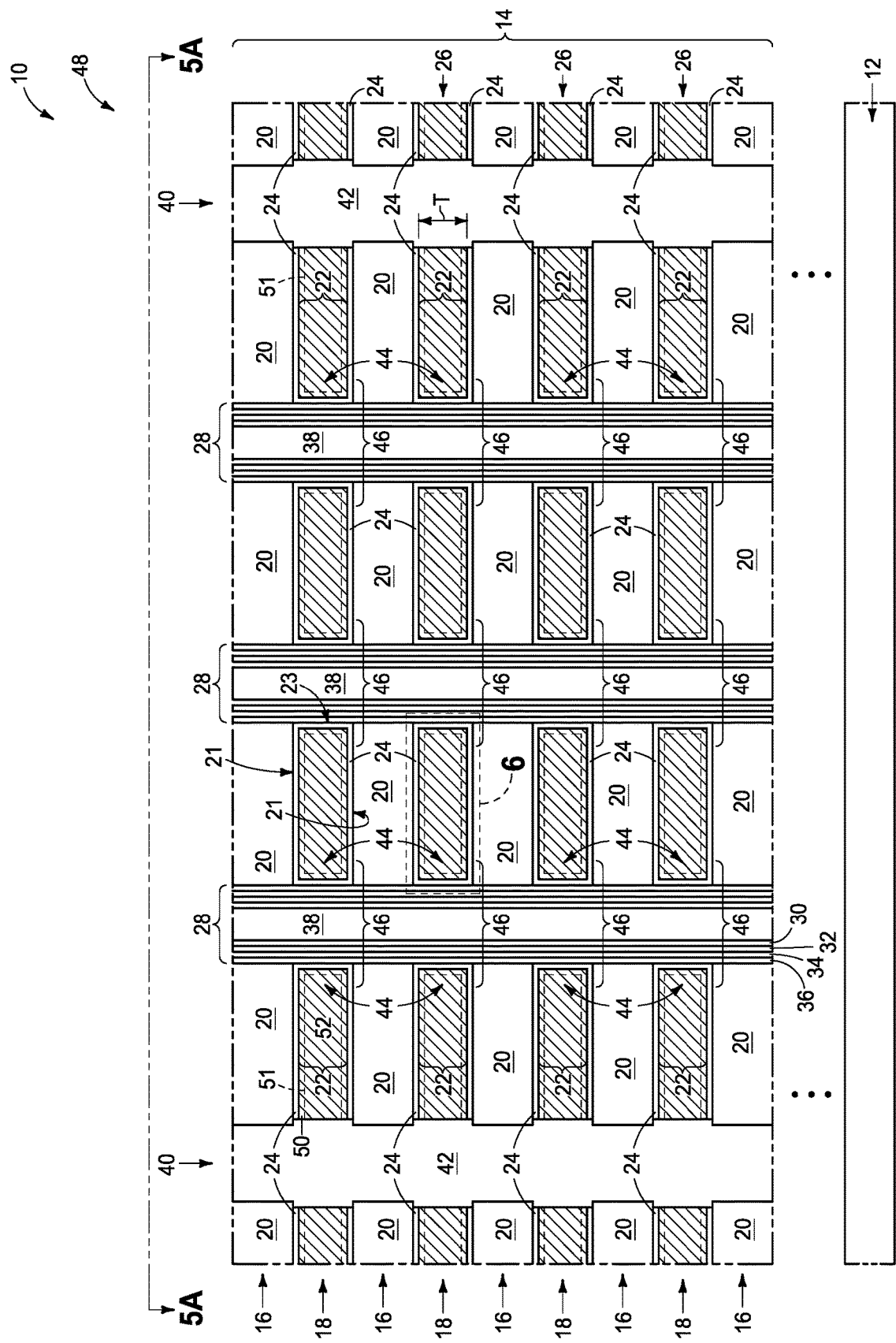
FIG. 5 is a diagrammatic cross-sectional side view of a region of an integrated assembly comprising an example memory array.
Figure 5A:
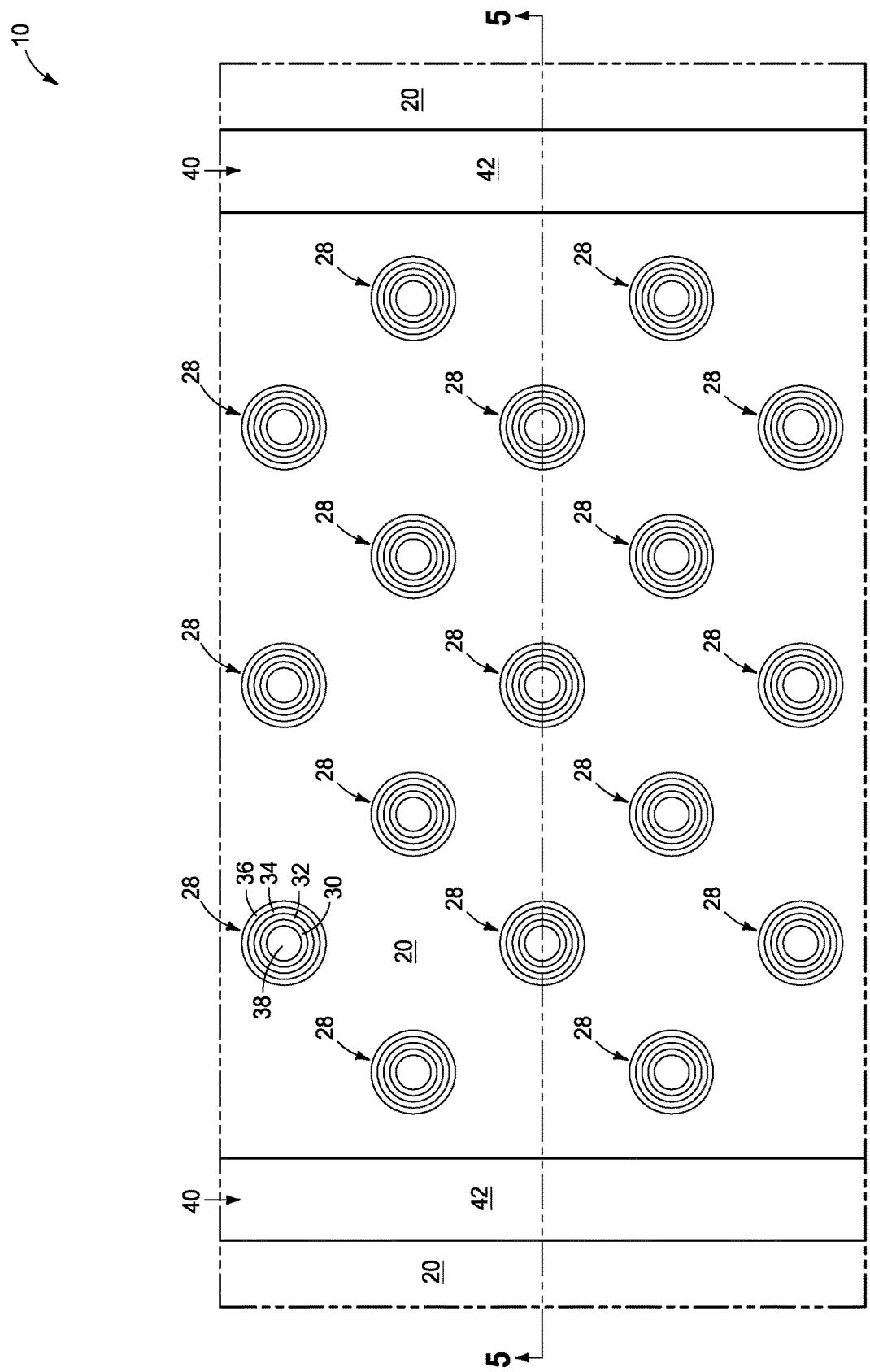
FIG. 5A is a diagrammatic top-down view along the line 5A-5A of FIG. 5.

Referring to FIGS. 5 and 5A, a construction 10 (which may also be referred to as an integrated assembly, or as an integrated structure) includes a stack 14 of alternating first and second levels 16 and 18.

The first levels 16 comprise insulative material 20, and the second levels 18 comprise conductive regions 22. The levels 16 and 18 may be of any suitable thicknesses. The levels 16 may be of different thicknesses than the levels 18, or may be the same thicknesses as the levels 18. In some embodiments, the levels 16 and 18 may have thicknesses within a range of from about 5 nm to about 50 nm. In some embodiments, the conductive regions 22 may have thicknesses T within a range of from about 5 nm to about 50 nm.

The insulative material 20 may comprise any suitable composition or combination of compositions; and in some embodiments may comprise, consist essentially of, or consist of silicon dioxide.

Insulative material 24 extends around the conductive regions 22. The insulative material 24 may correspond to dielectric-barrier material; and may comprise any suitable composition(s). In some embodiments, the dielectric-barrier material 24 may comprise high-k material (for instance, one or more of aluminum oxide, hafnium oxide, zirconium oxide, tantalum oxide, etc.); where the term "high-k" means a dielectric constant greater than that of silicon dioxide. Although the insulative material 24 is shown to be a single homogenous material, in other embodiments the insulative material may comprise two or more discrete compositions. The insulative material 24 has horizontally-extending segments 21, and has vertically-extending segments 23.

The conductive regions 22 comprise conductive wordlines. In some embodiments, the conductive levels 18 may be referred to as wordline levels (or memory cell levels) of a NAND configuration. The NAND configuration can include a string of memory cells (a so-called NAND string), with the number of memory cells in the string being determined by the number of memory cell levels 18. The NAND string may comprise any suitable number of memory cell levels. For instance, the NAND string may have 8 memory cell levels, 16 memory cell levels, 32 memory cell levels, 64 memory cell levels, 512 memory cell levels, 1024 memory cell levels, etc.

The levels 16 may be referred to as insulative levels which alternate with the wordline levels 18 within the stack 14. Such insulative levels 16 may be considered to include the insulative material 20, and to include the horizontally-extending segments 21 of the insulative material 24.

Structures 28 extend through the stack 14. The structures 28 may be referred to as channel material structures in that they comprise channel material 30. The channel material 30 comprises semiconductor material; and may comprise any suitable composition or combination of compositions. For instance, the channel material 30 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15).

Tunneling material (sometimes referred to as gate dielectric material) 32, charge-storage material 34 and charge-blocking material 36 are between the channel material 30 and the vertically-stacked levels 16/18. The tunneling material, charge-storage material and charge-blocking material may comprise any suitable compositions or combinations of compositions.

In some embodiments, the tunneling material 32 may comprise, for example, one or more of silicon dioxide, aluminum oxide, hafnium oxide, zirconium oxide, etc.

In some embodiments, the charge-storage material 34 may comprise charge-trapping materials, such as silicon nitride, silicon oxynitride, conductive nanodots, etc. In alternative embodiments, the charge-storage material 34 may be configured to include floating gate material (such as, for example, polycrystalline silicon).

In some embodiments, the charge-blocking material 36 may comprise one or more of silicon dioxide, aluminum oxide, hafnium oxide, zirconium oxide, etc.

In the illustrated embodiment, the channel material 30 is configured as annular rings within each of the structures 28. Insulative material 38 fills such annular rings. The insulative material 38 may comprise any suitable composition or combination of compositions, such as, for example, silicon dioxide. The illustrated structures 28 may be considered to comprise hollow channel configurations, in that the insulative material 38 is provided within "hollows" in the annular ring-shaped channel configurations. In other embodiments (not shown), the channel material may be configured as a solid pillar configuration.

The channel material structures 28 may be considered to comprise all of the materials 30, 32, 34, 36 and 38 in combination. The top view of FIG. 5A shows that the channel material structures 28 may be arranged in a hexagonally-packed pattern.

Slits (trenches) 40 extend through the stack 14, and such slits are filled with insulative material 42. The insulative material 42 may comprise any suitable composition(s), and in some embodiments may comprise, consist essentially of, or consist of silicon dioxide.

In some embodiments, the stack 14 may be considered to be a vertically-extending stack, and the structures 28 may be considered to be vertically-extending channel material structures which pass through the stack 14.

The stack 14 is over a supporting base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 12 and the stack 14 to diagrammatically indicate that there may be one or more additional materials, components, etc., provided between the base 12 and the stack 14. Such additional components may include, for example, conductive source lines, select gates, etc.

The wordline levels 18 comprise conductive gates 44 (only some of which are labeled) adjacent the channel material structure 28. The conductive gates 44, together with vertically-extending regions 23 of the dielectric-barrier material 24 and with regions of the channel material structures 28, form memory cells 46. Such memory cells are incorporated into a three-dimensional NAND memory array 48 analogous to the NAND memory arrays described above with reference to FIGS. 1-4. The memory cells 46 are all substantially identical to one another (with the term "substantially identical" meaning identical to within reasonable tolerances of fabrication and measurement).

In operation, the charge-storage material 34 may be configured to store information in the memory cells 46. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 44, and/or based on the value of voltage applied to an associated channel material 30.

The tunneling material 32 forms tunneling regions of the memory cells 46. Such tunneling regions may be configured to allow desired migration (e.g., transportation) of charge (e.g., electrons) between the charge-storage material 34 and the channel material 30. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 36 is adjacent to the charge-storage material 34, and may provide a mechanism to block charge from flowing from the charge-storage material 34 to the associated gates 44. The dielectric-barrier material 24 is provided between the charge-blocking material 36 and the associated gates 44, and may be utilized to inhibit back-tunneling of charge carriers from the gates 44 toward the charge-storage material 34. In some embodiments, the dielectric-barrier material 24 may be considered to form dielectric-barrier regions within the memory cells 46.

In the illustrated embodiment of FIG. 5, the conductive regions 22 include a pair of metal-containing materials 50 and 52. The metal-containing material 50 may be referred to as a first metal-containing material, and the metal-containing material 52 may be referred to as a second metal-containing material. Dashed lines 51 are provided to illustrate approximate boundaries between the first and second metal-containing materials 50 and 52.

The first and second metal-containing materials 50 and 52 extend along the entireties of the wordline levels, and are included within the conductive gates 44.

Figure 6:
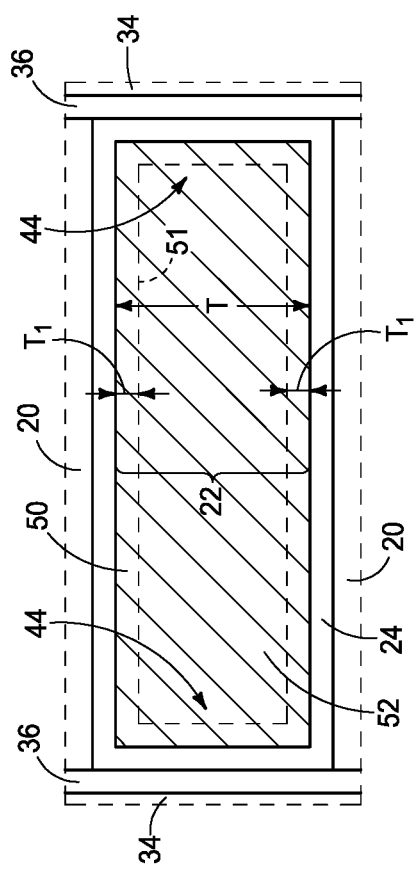
FIG. 6 is a diagrammatic cross-sectional enlarged view of a region labeled "6" of the example memory array of FIG. 5.
Figure 7:
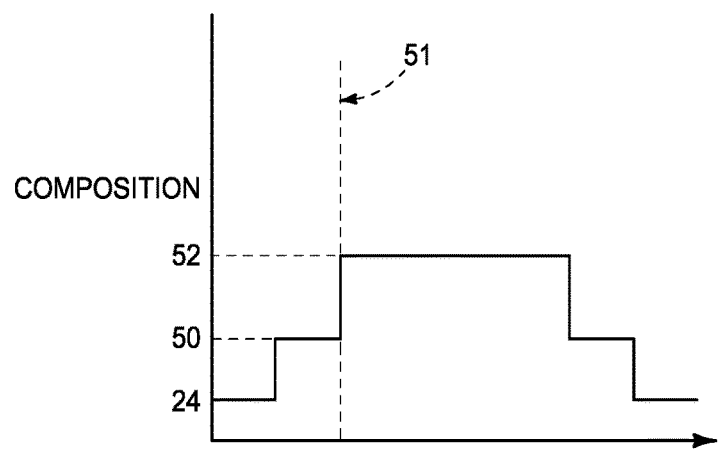
FIGS. 7-9 are graphs illustrating example relationships of composition versus depth for example assemblies.

FIG. 6 shows an enlarged view of a region "6" of FIG. 5 to better illustrate the first and second metal-containing materials 50 and 52 of one of the conductive regions 22.

The first metal-containing material 50 surrounds the second metal-containing material 52 in the illustrated region of FIG. 6. In some embodiments, the second metal-containing material 52 may be considered to comprise an outer periphery corresponding approximately to the illustrated location of the dashed line 51. The first metal-containing material 50 is adjacent to said outer periphery of the second metal-containing material 52. The first metal-containing material 50 may entirely surround the outer periphery 51 of the second metal-containing material 52, as shown. In some embodiments, the first metal-containing material 50 may at least partially surround the second metal-containing material 52. The term "at least partially surround" includes configurations in which the first metal-containing material entirely surrounds the second metal-containing material 52, and configurations in which there may be some regions of the periphery 51 of the second metal-containing material 52 which are not overlapped by the first metal-containing material 50. In some embodiments, the first metal-containing material 50 may be considered to envelop, or at least substantially envelop, the second metal-containing material 52 of the conductive regions 22. The term "substantially envelop" is utilized to indicate that the first metal-containing material 50 extends around at least about 90% of the area of the outer boundary 51 of the second metal-containing material 52.

The first and second metal-containing materials 50 and 52 differ from one another in crystallinity, with the second metal-containing material having a larger mean (average) grain size than the first metal-containing material. In some embodiments, the second metal-containing material 52 may have a mean grain size within a range of from greater than or equal to about 5 nm to less than or equal to about 200 nm, while the first metal-containing material 50 has a mean grain size of less than or equal to about 10 nm (the mean grain sizes may be determined with any suitable methodology). In some embodiments the first metal-containing material 50 may be substantially amorphous (with the term "substantially amorphous" meaning amorphous to within reasonable tolerances of fabrication and measurement); and may, for example, consist essentially of, or consist of amorphous material.

The first metal-containing material 50 may be continuous in some embodiments (or at least substantially continuous, with the term "substantially continuous" meaning continuous to within reasonable tolerances of fabrication and measurement), and may be discontinuous in other embodiments. If the first metal-containing material 50 is continuous, such material may have a thickness $T_1$ along the illustrated cross-section of FIG. 6 within a range of from about 5 Å to about 100 Å. In some embodiments, the conductive region 22 may have an overall thickness (total thickness) T which is within a range of from about 5 nm to about 50 nm along the cross-section of FIG. 6. The thickness $T_1$ of the first metal-containing material 50 may be within a range of from about 5% of the total thickness T to about 25% of the total thickness T.

Figure 8:
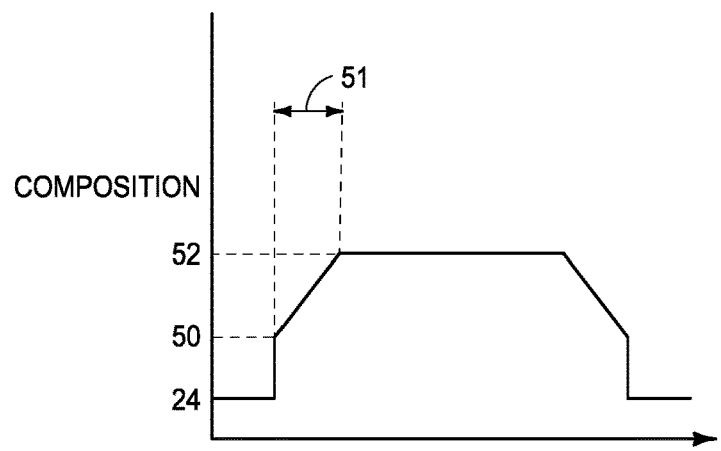
Figure 9:
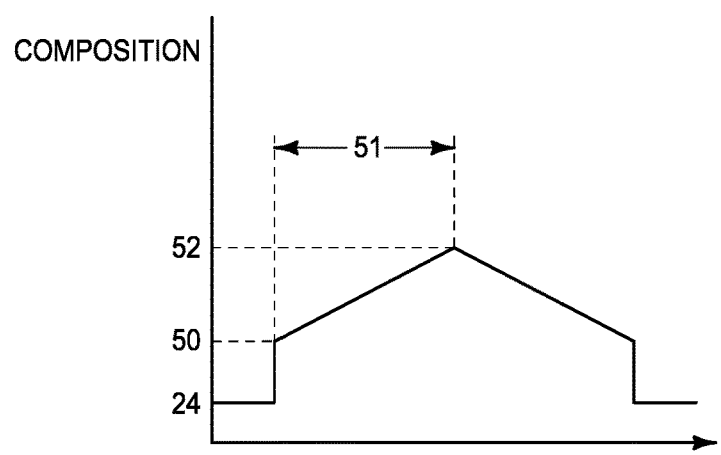

The dashed line 51 may be considered to represent an interface between the first and second metal-containing materials 50 and 52. Such interface may be an abrupt boundary where the low-crystallinity material 50 meets the high-crystallinity material 52 (with the terms "low-crystallinity" and "high-crystallinity" being utilized to indicate that the material 50 has lower crystallinity than the material 52), or may be a gradient. For instance, FIGS. 7-9 graphically illustrate example embodiments in which the boundary 51 is an abrupt boundary (FIG. 7) and a gradient (FIGS. 8 and 9). The abrupt boundary of FIG. 7 may be referred to as an abrupt interface.

The first and second metal-containing materials 50 and 52 of FIG. 6 may comprise the same composition as one another, or may comprise different compositions relative to one another.

In some embodiments, the first metal-containing material 50 comprises one or more metals in combination with one or more of nitrogen, carbon, silicon, germanium and oxygen. Accordingly, the first metal-containing material 50 may include one or more of various metal silicides, metal nitrides, metal carbides, metal oxides and metal germides. In some embodiments, the metal within the first metal-containing material 50 may include one or more of tungsten, tantalum, titanium, ruthenium, molybdenum, cobalt, nickel and aluminum. In some specific examples, the first metal-containing material 50 may include one or more metal nitrides; and may, for example, comprise, consist essentially of, or consist of one or both of tungsten nitride and titanium nitride.

In some embodiments, the second metal-containing material 52 may comprise one or more of tungsten, tantalum, titanium, ruthenium, molybdenum, cobalt, nickel, aluminum, copper, platinum and palladium. In some embodiments, the second metal-containing material 52 may be the same composition as the first metal-containing material 50, and may include one or more of various metal silicides, metal nitrides, metal carbides, metal oxides and metal germides. In other embodiments, the second metal-containing material 52 may consist essentially of, or consist of, one or more metals selected from the group consisting of tungsten, tantalum, titanium, ruthenium, molybdenum, cobalt, nickel, aluminum, copper, platinum and palladium. In some embodiments the metal(s) within the first metal-containing material 50 may be referred to as first metal(s), and the metal(s) within the second metal-containing material 52 may be referred to as second metal(s).

Figure 10:
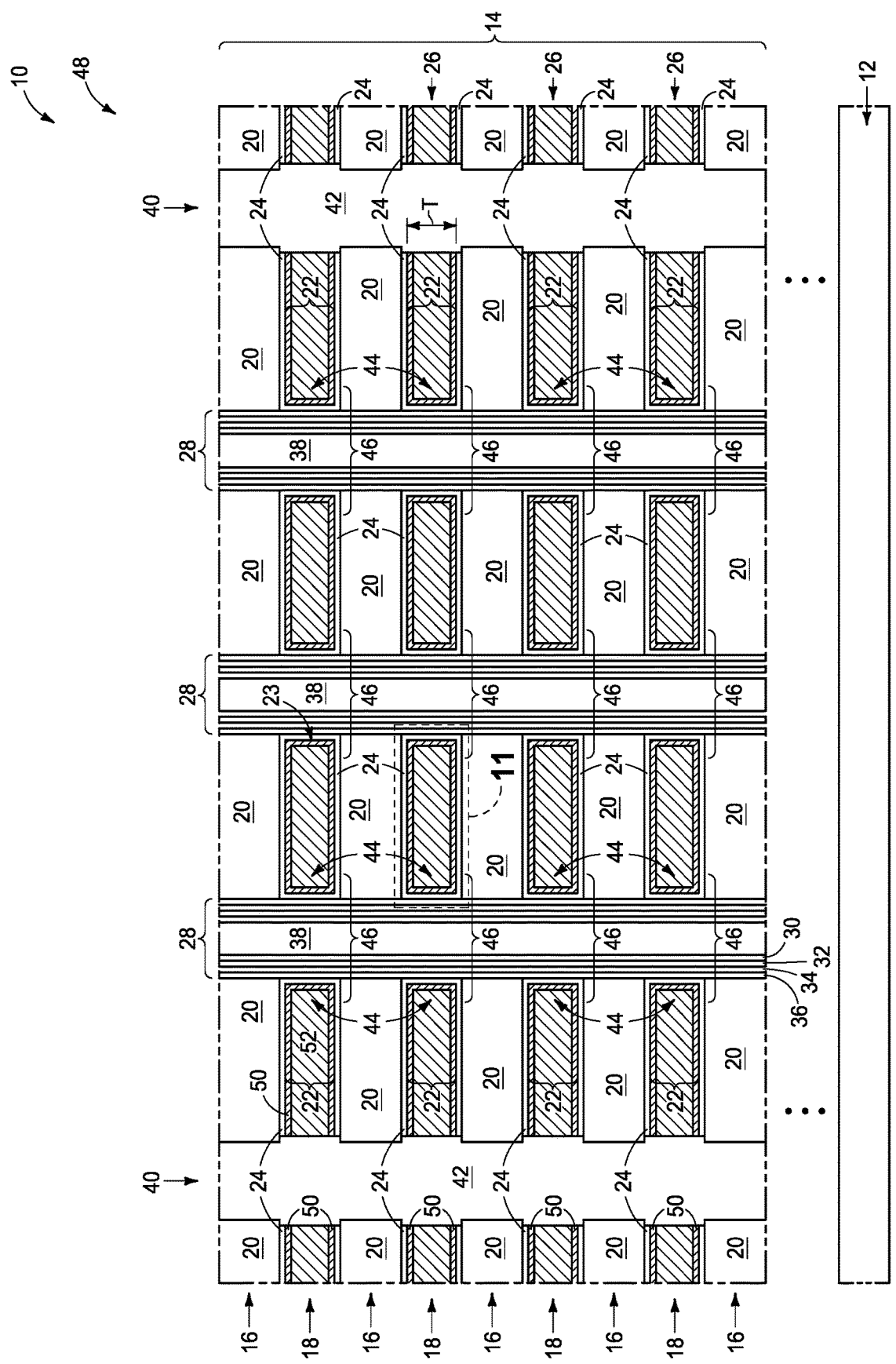
FIG. 10 is a diagrammatic cross-sectional side view of a region of an integrated assembly comprising an example memory array.
Figure 11:
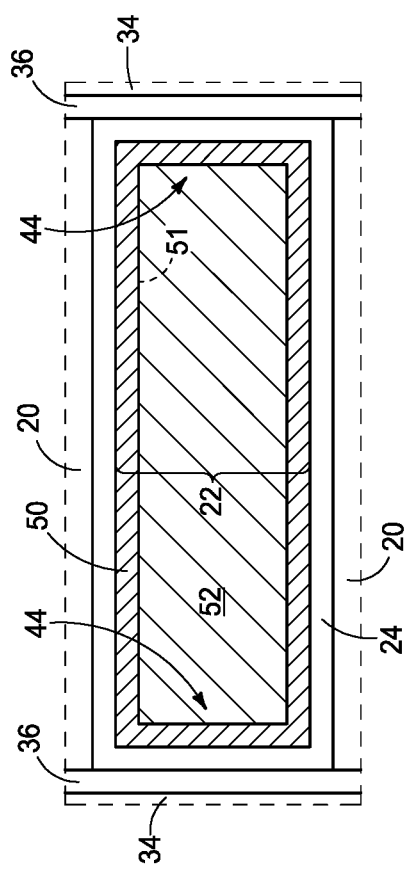
FIG. 11 is a diagrammatic cross-sectional enlarged view of a region labeled "11" of the example memory array of FIG. 10.

FIG. 10 shows the integrated assembly 10 in a configuration in which the first and second metal-containing materials 50 and 52 comprise different compositions relative to one another. FIG. 11 shows an enlarged view of a region "11" of FIG. 10, and shows that the boundary 51 corresponds to an interface between the first metal-containing material 50 and the second metal-containing material 52. The first and second metal-containing materials 50 and 52 of FIGS. 10 and 11 may comprise the same compositions as described above. In some embodiments, the first metal-containing material 50 may comprise, consist essentially of, or consist of one or both of tungsten nitride and titanium nitride; and the second metal-containing material 52 may comprise, consist essentially of, or consist of tungsten.

Figure 12A:
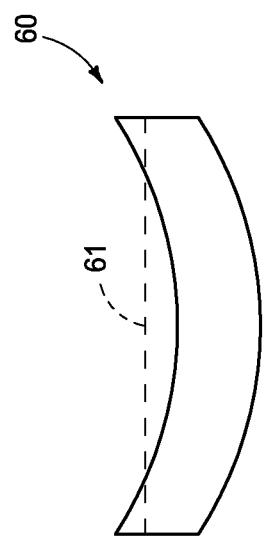
FIGS. 12A and 12B are diagrammatic cross-sectional side views of semiconductor wafers illustrating a bowed configuration (FIG. 12A), and a configuration which is not bowed (FIG. 12B).
Figure 12B:
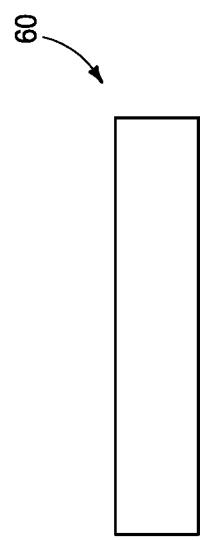

The configurations of FIGS. 5-11 may alleviate or prevent the wafer-bowing problems described above in the Background section. FIGS. 12A and 12B show a wafer 60 in a bowed configuration (FIG. 12A) and a non-bowed configuration (FIG. 12B). The bowed configuration of FIG. 12A can result from problematic stresses imposed by conductive materials utilized in conventional wordlines of NAND configurations. A dashed line 61 is provided in FIG. 12A to assist the reader in visualizing the bowed configuration of the illustrated wafer 60. In contrast, the planar (non-bowed) configuration of the wafer 60 shown in FIG. 12B can be achieved utilizing wordline configurations of FIGS. 5-11. Specifically, the thin, low-crystalline first metal-containing material 50 can form an adhesive template to support the second metal-containing material 52. Since there are few, if any, grain boundaries along a surface of the template material 50, the second material 52 will have relatively few nucleation sites as compared to configurations in which the template material 50 is more crystalline; which can enable the second material 52 to have larger crystalline grains than would be achieved utilizing a template material 50 having higher crystallinity. The larger crystalline grains of the second material 52, together with the thin, low-crystalline nature of the first material 50, may enable the conductive wordline regions 22 to be formed with fewer problematic stresses than is achievable with conventional wordline configurations. Such may enable the problematic wafer bowing of conventional configurations to be alleviated, or even prevented. The mechanism discussed above for alleviating problematic stresses is provided to assist the reader in understanding the embodiments described herein, and is not to limit any aspects of any inventions described herein except to the extent, if any, that the mechanism is expressly recited in the claims which follow.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory cell. The memory cell includes a conductive gate which has a first metal-containing material substantially enveloping a second metal-containing material. The first and second metal-containing materials differ from one another in crystallinity, with the second metal-containing material having a larger mean grain size than the first metal-containing material. A charge-blocking region is adjacent the conductive gate. A charge-storage region is adjacent the charge-blocking region. A tunneling material is adjacent the charge-storage region. A channel material is adjacent the tunneling material. The tunneling material is between the channel material and the charge-storage region.

Some embodiments include an assembly having a vertical stack of alternating insulative levels and wordline levels. The wordline levels include conductive regions. The conductive regions have a first metal-containing material adjacent an outer periphery of a second metal-containing material. The first and second metal-containing materials differ from one another in crystallinity and composition. The second metal-containing material has a larger mean grain size than the first metal-containing material. Charge-storage regions are adjacent the conductive regions. Charge-blocking regions are between the charge-storage regions and the conductive regions.

Some embodiments include a memory array having a vertical stack of alternating insulative levels and wordline levels. Channel material extends vertically along the stack. The wordline levels include conductive regions which have a first metal-containing material and a second metal-containing material. The first metal-containing material at least partially surrounds the second metal-containing material. The first metal-containing material is substantially amorphous, and the second metal-containing material has a mean grain size within a range of from greater than or equal to about 5 nm to less than or equal to about 200 nm. Charge-storage regions are adjacent the wordline levels. Charge-blocking regions are between the charge-storage regions and the conductive regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
    a conductive gate; the conductive gate including a first metal-containing material substantially enveloping a second metal-containing material; the first and second metal-containing materials differing from one another in crystallinity, with the second metal-containing material having a larger mean grain size than the first metal-containing material;
    a charge-blocking region adjacent the conductive gate;
    a charge-storage region adjacent the charge-blocking region;
    a tunneling material adjacent the charge-storage region; and
    a channel material adjacent the tunneling material, the tunneling material being between the channel material and the charge-storage region;
    wherein the first metal-containing material has a mean grain size of less than or equal to about 10 nm; and
    wherein the first metal-containing material comprises one or more metals in combination with one or more of carbon, germanium and oxygen.

2. The memory cell of claim 1 wherein the second metal-containing material has a mean grain size within a range of from greater than or equal to about 5 nm to less than or equal to about 200 nm.

3. The memory cell of claim 1 wherein the first metal-containing material is substantially amorphous.

4. The memory cell of claim 1 wherein the first metal-containing material is a single, continuous structure.

5. The memory cell of claim 1 wherein the first metal-containing material has a thickness along a cross-section within a range of from about 5 Å to about 100 Å.

6. The memory cell of claim 1 wherein the first and second metal-containing materials meet along an abrupt interface.

7. The memory cell of claim 1 wherein the first and second metal-containing materials meet along a gradient.

8. The memory cell of claim 1 wherein the first and second metal-containing materials are a same composition as one another.

9. The memory cell of claim 1 wherein the first and second metal-containing materials are different compositions relative to one another.

10. The memory cell of claim 1 wherein said one or more metals include one or more of tungsten, tantalum, titanium, ruthenium, molybdenum, cobalt, nickel and aluminum.

11. The memory cell of claim 1 wherein said one or more metals include one or both of tungsten and titanium.

12. The memory cell of claim 1 wherein the first metal-containing material comprises one or more metal nitrides.

13. The memory cell of claim 1 wherein the first metal-containing material comprises one or both of tungsten nitride and titanium nitride.

14. The memory cell of claim 1 wherein the second metal-containing material comprises one or more of tungsten, tantalum, titanium, ruthenium, molybdenum, cobalt, nickel, aluminum, copper, platinum and palladium.

15. The memory cell of claim 1 wherein the first metal-containing material surrounds an entirety of a periphery portion of the second metal-containing material.

16. The memory cell of claim 1 wherein the first metal-containing material surrounds an entirety of a periphery portion of the second metal-containing material, the periphery portion comprising a pair of opposite sidewalls extending between upper and lower walls.

17. The memory cell of claim 1 wherein the first metal-containing material comprises a periphery having two sidewalls extending between an upper and lower wall; and
   further comprising an insulative layer adjacent at least one of the two sidewalls of the first metal-containing material.

18. The memory cell of claim 17 wherein the insulative layer comprises dielectric-barrier material.

19. The memory cell of claim 1 wherein the first metal-containing material surrounds an entire structure of the second metal-containing material.

20. The memory cell of claim 1 further comprising:
   an insulative layer surrounding an entire structure of the first and second metal-containing material; and
   a dielectric barrier layer along one of a top and a bottom of the insulative layer, and not along opposite sides of the insulative layer.

21. An assembly, comprising:
   a vertical stack of alternating insulative levels and wordline levels, the wordline levels comprising conductive regions; the conductive regions including a first metal-containing material adjacent and extending along an entirety of an outer periphery of a sidewall of a second metal-containing material, the sidewall extending between an upper and lower surface of the second metal-containing material; the first and second metal-containing materials differing from one another in crystallinity and composition; the second metal-containing material having a larger mean grain size than the first metal-containing material;
   charge-storage regions adjacent the conductive regions;
   charge-blocking regions between the charge-storage regions and the conductive regions; and
   wherein the first metal-containing material comprises one or more of tantalum, ruthenium and aluminum.

22. The assembly of claim 21 wherein each of the wordline levels has a total thickness along a cross-section within a range of from about 5 nm to about 50 nm; and wherein the first metal-containing material has a thickness along the cross-section within a range of from about 5% of the total thickness to about 25% of the total thickness.

23. The assembly of claim 21 wherein:
   the first metal-containing material comprises the one or more first metals in combination with one or more of carbon, germanium, silicon and oxygen; and
   the second metal-containing material consists essentially of one or more second metals.

24. The assembly of claim 21 wherein said one or more second metals include one or more of tungsten, tantalum, titanium, ruthenium, molybdenum, cobalt, nickel, aluminum, copper, platinum and palladium.

25. The assembly of claim 21 wherein the first metal-containing material comprises one or more both of tungsten nitride and titanium nitride; and wherein the second metal-containing material consists essentially of tungsten.

26. The assembly of claim 21 wherein the first metal-containing material is substantially amorphous.

27. The assembly of claim 21 wherein the first metal-containing material has a mean grain size of less than or equal to about 10 nm.

28. The assembly of claim 27 wherein the second metal-containing material has a mean grain size within a range of from greater than or equal to about 5 nm to less than or equal to about 200 nm.

29. The assembly of claim 21 wherein the second metal-containing material comprises opposite sidewalls and wherein the first metal-containing material is adjacent each sidewall of the second metal-containing material.

30. The assembly of claim 21 wherein the second metal-containing material comprises opposite sidewalls extending between upper and lower walls, and wherein the first metal-containing material is adjacent each sidewall and adjacent the upper and lower walls of the second metal-containing material.

31. The memory cell of claim 21 wherein the first metal-containing material comprises a periphery having two sidewalls extending between an upper and lower wall; and
   further comprising an insulative layer adjacent at least one of the two sidewalls of the first metal-containing material.

32. The memory cell of claim 31 wherein the insulative layer comprises dielectric-barrier material.

33. The memory cell of claim 21 wherein the first metal-containing material surrounds an entire structure of the second metal-containing material.

34. The memory cell of claim 21 further comprising:
   an insulative layer surrounding an entire structure of the first and second metal-containing material; and
   a dielectric barrier layer along one of a top and a bottom of the insulative layer, and not along opposite sides of the insulative layer.

35. A memory array, comprising:
   a vertical stack of alternating insulative levels and wordline levels;
   channel material extending vertically along the stack;
   the wordline levels comprising conductive regions; the conductive regions including a first metal-containing material and a second metal-containing material, with the first metal-containing material at least partially surrounding the second metal-containing material; the first metal-containing material being substantially amorphous and the second metal-containing material having a mean grain size within a range of from greater than or equal to about 5 nm to less than or equal to about 200 nm;
   charge-storage regions adjacent the wordline levels;
   charge-blocking regions between the charge-storage regions and the conductive regions; and
   wherein said one or more second metals include one or more of tantalum, platinum and palladium.

36. The memory array of claim 35 wherein the first metal-containing material is continuous.

37. The memory array of claim 36 wherein each of the wordline levels has a total thickness along a cross-section within a range of from about 5 nm to about 50 nm; and wherein the first metal-containing material has a thickness along the cross-section within a range of from about 5 Å to about 100 Å.

38. The memory array of claim 35 wherein the first metal-containing material is discontinuous.

39. The memory array of claim 35 wherein:
   the first metal-containing material comprises one or more first metals in combination with one or more of nitrogen, carbon, germanium, silicon and oxygen; and
   the second metal-containing material consists essentially of one or more second metals.

40. The memory array of claim 39 wherein said one or more first metals include one or more of tungsten, tantalum, titanium, ruthenium, molybdenum, cobalt, nickel and aluminum.

41. The memory array of claim 35 wherein the first metal-containing material comprises one or more both of tungsten nitride and titanium nitride; and wherein the second metal-containing material consists essentially of tungsten.

42. The memory array of claim 35 wherein charge-storage regions, charge-blocking regions and channel material are layers having respective thicknesses, and wherein the channel material has a thickness substantially similar to a thickness of at least one of the charge-storage regions or the charge-blocking regions.

43. The memory array of claim 35 wherein the first metal-containing material substantially enveloping the second metal-containing material.

44. The memory cell of claim 35 wherein the first metal-containing material comprises a periphery having two sidewalls extending between an upper and lower wall; and
    further comprising an insulative layer adjacent at least one of the two sidewalls of the first metal-containing material.

45. The memory cell of claim 44 wherein the insulative layer comprises dielectric-barrier material.

46. The memory cell of claim 35 wherein the first metal-containing material surrounds an entire structure of the second metal-containing material.

47. The memory cell of claim 35 further comprising:
    an insulative layer surrounding an entire structure of the first and second metal-containing material; and
    a dielectric barrier layer along one of a top and a bottom of the insulative layer, and not along opposite sides of the insulative layer.

\* \* \* \* \*